United States Patent
McKenzie (10) Patent No.: US 9,178,119 B2
(45) Date of Patent: Nov. 3, 2015

(54) VERTICAL LIGHT EMITTING DIODES

(71) Applicant: PhotonStar LED Limited, Romsey, Hampshire (GB)

(72) Inventor: James Stuart McKenzie, Romsey (GB)

(73) Assignee: PhotonStar LED Limited, Romsey (GB)

( * ) Notice: Subject to any disclaimer, the term of this patent is extended or adjusted under 35 U.S.C. 154(b) by 0 days.

(21) Appl. No.: 14/068,673

(22) Filed: Oct. 31, 2013

(65) Prior Publication Data
US 2014/0054625 A1     Feb. 27, 2014

Related U.S. Application Data

(63) Continuation of application No. 12/529,098, filed as application No. PCT/GB2008/000710 on Mar. 3, 2008, now Pat. No. 8,592,842.

(30) Foreign Application Priority Data

Mar. 2, 2007   (GB) .................................. 0704120.5

(51) Int. Cl.
*H01L 33/50*    (2010.01)
*H01L 33/40*    (2010.01)
(Continued)

(52) U.S. Cl.
CPC ............ *H01L 33/507* (2013.01); *H01L 33/405* (2013.01); *H05B 33/0857* (2013.01);
(Continued)

(58) Field of Classification Search
CPC ....... H01L 33/00; H01L 33/50; H01L 33/405; H01L 33/507; H01L 33/64; H01L 27/156
See application file for complete search history.

(56) References Cited

U.S. PATENT DOCUMENTS 5,779,924 A   7/1998   Krames et al.
5,874,747 A   2/1999   Redwing et al.
(Continued)

FOREIGN PATENT DOCUMENTS

WO         01/47038      6/2001

OTHER PUBLICATIONS

Wierer et al., "High-Power AlGaInN Flip-Chip Light Emitting Diodes," Applied Physics Letters, May 28, 2001, pp. 3379-3381, vol. 78, No. 22.

(Continued)

*Primary Examiner* — Tan N Tran
*Assistant Examiner* — Fazli Erdem
(74) *Attorney, Agent, or Firm* — Renner, Otto, Boisselle and Sklar, LLP (57) ABSTRACT

A tunable color LED module comprises at least two sub-modules, each comprising an LED, a wavelength converting element (WCE) and a reflector cup. The total light emitted by the module comprises light generated from each LED and WCE and the module is configured to emit a total light having a predefined color chromaticity when activation properties of the LEDs are managed appropriately. The total light may have a broad white emission spectrum. The module combines the benefits of a low cost with uniform chromaticity properties in the far field, and offers long and controlled lifetime at the same time as flexibility and intelligence of tunable color chromaticity, Color Rendering Index (CRI) and intensity, either at manufacture or in an end user lighting application. A controlled LED module system comprises a control system for the managing activation properties of the LEDs in the sub-modules. Also described is a method of manufacture.

17 Claims, 9 Drawing Sheets

(51) Int. Cl.
*H05B 33/08* (2006.01)
*H01L 33/00* (2010.01)
*H01L 33/22* (2010.01)
*H01L 33/38* (2010.01)
*H01L 33/44* (2010.01)

(52) U.S. Cl.
CPC ............ *H01L33/0079* (2013.01); *H01L 33/22* (2013.01); *H01L 33/38* (2013.01); *H01L 33/44* (2013.01); *H01L 2924/0002* (2013.01)

(56) References Cited

U.S. PATENT DOCUMENTS

| | | | |
|---|---|---|---|
| 5,962,971 A | 10/1999 | Chen | |
| 6,015,719 A | 1/2000 | Kish, Jr. et al. | |
| 6,323,063 B2 | 11/2001 | Krames et al. | |
| 6,455,340 B1 | 9/2002 | Chua et al. | |
| 6,784,462 B2 | 8/2004 | Schubert | |
| 6,884,646 B1 | 4/2005 | Wu et al. | |
| 7,829,905 B2 * | 11/2010 | Huang et al. | 257/98 |
| 8,309,979 B2 * | 11/2012 | McKenzie et al. | 257/93 |
| 8,556,438 B2 * | 10/2013 | McKenzie et al. | 362/84 |
| 8,592,842 B2 * | 11/2013 | McKenzie | 257/98 |
| 8,931,906 B2 * | 1/2015 | Huang et al. | 353/37 |
| 2002/0038869 A1 | 4/2002 | Takaoka | |
| 2003/0160257 A1 | 8/2003 | Bader et al. | |
| 2003/0209714 A1 * | 11/2003 | Taskar et al. | 257/79 |
| 2004/0056254 A1 | 3/2004 | Bader et al. | |
| 2004/0119083 A1 * | 6/2004 | Su et al. | 257/98 |
| 2006/0154389 A1 | 7/2006 | Doan | |
| 2007/0170596 A1 * | 7/2007 | Wen et al. | 257/777 |
| 2008/0217634 A1 * | 9/2008 | Liu et al. | 257/98 |
| 2010/0123153 A1 * | 5/2010 | Lin et al. | 257/98 |
| 2010/0140637 A1 * | 6/2010 | Donofrio et al. | 257/98 |
| 2010/0277887 A1 * | 11/2010 | Su et al. | 362/19 |
| 2011/0204403 A1 * | 8/2011 | Kim et al. | 257/98 |
| 2012/0050694 A1 * | 3/2012 | Huang et al. | 353/38 |
| 2014/0034991 A1 * | 2/2014 | McKenzie et al. | 257/98 |
| 2015/0008465 A1 * | 1/2015 | Saenger Nayver et al. | 257/98 |

OTHER PUBLICATIONS

Schnitzer et al. "30% External Quantum Efficiency from Surface Textured, Thin-Film Light-Emitting Diodes," Applied Physics Letters, Oct. 18, 1993, pp. 2174-2176, vol. 63, No. 16.
International Search Report for corresponding International Application No. PCT/GB2008/000710, dated Aug. 1, 2008.
UK Search Report for corresponding GB Application No. 0704120.5, dated Jun. 25, 2008.
International Report on Patentability and Written Opinion for corresponding International Application No. PCT/GB2008/000710, dated Aug. 9, 2009.
Non-Final Office Action for corresponding U.S. Appl. No. 12/529,098, dated Apr. 23, 2013.
Notice of Allowance for corresponding U.S. Appl. No. 12/529,098, dated Oct. 22, 2013.

* cited by examiner

PRIOR ART

VERTICAL LIGHT EMITTING DIODES

FIELD OF THE INVENTION

The present invention relates to vertical, flip-chip light emitting devices and particularly to the use of conductive multilayer reflector structures in such devices.

BACKGROUND TO THE INVENTION

Vertical light emitting diodes typically employ metal substrates and top contact regions. These characteristically introduce optical loss to trapped waveguide modes residing in the light emitting region. Currently, top surface roughening techniques are employed to extract the maximum amount of light on the first pass of light incident on the top surface. However, if light is multiply scattered by the bottom metal reflector then loss is introduced to the trapped waveguide mode.

Light emitting diodes (LEDs) are based on a forward biased p-n junction. Recently, LEDs have reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by alternative fluorescent lighting technologies. The efficiencies of LEDs can be quantified by three main factors, namely internal quantum efficiency, injection efficiency, and extraction efficiency. The latter being the basis for the present invention.

One of the main limiting factors reducing the extraction efficiency in LEDs is the emitted photons being totally internally reflected and trapped in the high refractive index of the epi-material. These trapped waveguide modes propagate in the LED structure until they are scattered, escape or reabsorbed. The thickness of the LED structure determines the number of modes that can be set up.

Many methods have been successfully employed to improve light extraction in LED heterostructures. These include shaping LED die, as described in U.S. Pat. Nos. 6,015,719 and 6,323,063, flip-chip mounting of LEDs as described by Wierer et al. in Appl. Phys. Lett., 78, Pg. 3379, 2001, roughening of the top surface as taught by Schnitzer et al in Applied Physics Letters 63, 2174, 1993, and using omni-directional reflectors as suggested by Fink et al. in Science vol. 282, Pg. 1679, 1998. Other suggested methods include the use of periodic texturing on at least one interface of the structure to improve light extraction out of the light emitting region, as suggested in U.S. Pat. No. 5,779,924.

To provide light emitting devices with high current and thermal driving capabilities the vertical type n-p contact configuration in GaN material systems has been recently adopted. Such examples have been disclosed in U.S. Pat. No. 6,884,646 and U.S. Pat. 20060154389A1. However, one major drawback with such vertical type light emitting structures is the existence of optically lossy metal contacts in the close vicinity of the light emitting heterostructure. Trapped modes in the high index light emitting device typically undergo multiple internal reflections. The photons reflected at the interface between the metallic contact surface and the heterostructure material experiences large losses and hence reduces the total light output of the light emitting diode.

In U.S. Pat. No. 6,784,462 the use of an omni-directional reflector is proposed. This single dielectric electrically insulating layer is disposed between the light emitting region and the lower conductive region and having a plurality of electrical conductive vias contacting the lower light emitting region and an electrical contact. It is typically an object of vertical light emitting devices to provide good electrical and thermal conduction. However, the single dielectric layer residing between the light emitting region and the lower conductive region hinders good electrical conduction. In addition, a single dielectric layer will not provide true omni-directional reflectivity and light at angles residing within the escape cone formed between the light emitting medium and the dielectric layer will experience a reflection at the metal contact boundary, which will introduce optical loss. Additional loss in the light emitting device will also be experienced by the metal electrical contacts at the top surface of the device, which is not desirable.

Back Light Units (BLU) for LCD panels are key elements in the performance of an LCD panel. Currently most LCD panels employ compact cathode fluorescent light (ccfl) sources. However, these suffer from several problems such as poor colour gamut, environmental recycling and manufacture issues, thickness and profile, high voltage requirements, poor thermal management, weight and high power consumption. In order to alleviate these problems LCD manufacturers are implementing LED BLU units. These offer benefits in improved light coupling, colour gamut, lower power consumption, thin profiles, low voltage requirements, good thermal management and low weight.

Another application area for the present invention is in light engines for front and rear projectors. Conventional High Intensity Discharge (HID) type projector light engines have always been hindered by low efficiency and short lifetime resulting in slow adoption into consumer markets.

The present invention is directed towards another technique for improving the efficiency of LEDs, thereby enabling their use in various applications, including those described above.

SUMMARY OF THE INVENTION

The object of the invention is a vertical, flip-chip, light emitting device with a conducting substrate or carrier incorporating a low optical loss bottom reflector and low optical loss top contact.

According to a first aspect of the present invention, a light emitting device comprises:
 a first semiconductor layer having doping of a first type;
 a second semiconductor layer having doping of a second type;
 a light emitting region interdisposed between the first and second semiconductor layers;
 a first electrode layer disposed proximal to the first semiconductor layer and distal to the second semiconductor layer;
 a second electrode layer disposed proximal to the second semiconductor layer and distal to the first semiconductor layer; and
 a first multilayer reflector stack interdisposed between the first electrode layer and the first semiconductor layer, the first multilayer reflector stack comprising at least a first layer disposed proximal the first electrode layer and a last layer disposed distal the first electrode layer, wherein:
light generated in the light emitting region is extracted from the device through a surface of the second semiconductor layer;
the first multilayer reflector stack extends at least partially across a surface of the first semiconductor layer;
at least 60% of light incident on the first multilayer reflector stack that is generated in the light emitting region is reflected by the first stack; and
at least the first and the last layer of the first multilayer reflector stack are electrically conducting and optically transparent.

In the present invention, conductive multilayer stacks (CMS) are employed to act as low-loss, high-reflectivity regions masking the lossy metal contact regions away from the trapped waveguide modes. These are employed to provide both improved optical light extraction and a vertical conduction path for current spreading in the semiconductor light emitting device.

Preferably, the novel low loss bottom conductive multilayer reflector (CMR) stack is employed between the metal bottom contact and the p-GaN flip chip layer. Although reference is made to InGaN light emitting diodes, this is by way of example, and the present invention can be implemented in other light emitting material systems such as, but not restricted to, InGaAs, InGaP, ZnO.

Preferably, the top metal contact is deposited on top of another CMR stack to provide for reduced light attenuation from light emitted under the contact region. The finite top contact region contributes to a minimum of around 1% to 5% of the active top surface light emitting region and hence if the light emerging from under these regions can be allowed to escape with minimum loss then an increase in the total luminous output of the LED can be achieved.

Preferably, the bottom CMR stack and metal contact are roughened to allow for increased scattering and reduced specular reflectivity. This provides an increased probability of trapped light to diffusely reflect and reside in the escape cone of the light emitting material (GaN in this case).

The use of bottom and top CMR stack layers in the present invention allows the light emitting device to be thinned down to have a total thickness less than 3 µm. This permits the LED to achieve high extraction efficiency while still maintaining high current injection.

According to a second aspect of the present invention, a light emitting module for solid state lighting applications comprises:
a light emitting device according to the first aspect;
a first encapsulating material covering at least the light extracting surface of the second semiconductor layer;
a second encapsulating material overcoating at least the first encapsulating material; and,
a phosphor material interdisposed between the first and the second encapsulating materials.

In this way, a light emitting module is formed by embedding a phosphor in an encapsulating material that resides on top of the light emitting device of the present invention. The encapsulation comprises of two layers of optically transparent environmentally resistant material. The first encapsulation material that is disposed proximal to the light emitting device is formed of a high refractive index material and is textured or shaped to extract the maximum number of photons. The phosphor is subsequently disposed on the high refractive index encapsulant while another encapsulation material distal to the light emitting device is disposed on the top of the phosphor. The distal encapsulant is also shaped to provide the desired far field emission out of the light emitting module.

According to a third aspect of the present invention, a method of manufacturing the light emitting device of the first aspect or the light emitting module of the second aspect comprises the steps of:
growing each of the second semiconductor material, the light emitting region, and the first semiconductor material;
depositing a first multilayer reflector stack;
forming mesa isolation trenches in the light emitting device;
depositing a passivation layer;
depositing a first electrode;
attaching a conductive sub-mount;
removing growth substrate;
depositing a second multilayer reflector stack;
depositing a second electrode;
roughening a top surface of the second semiconductor layer; and
separating an isolated light emitting die.

In this way, a light emitting device or light emitting module can be fabricated having the desired high performance properties. Further steps may be performed to apply a suitable encapsulant and phosphor to the basic device structure.

BRIEF DESCRIPTION OF THE DRAWINGS

Examples of the present invention will now be described in detail with reference to the accompanying drawings, in which:

FIG. 7a-g illustrate the processing steps for fabricating a light emitting diode according to the present invention.

DETAILED DESCRIPTION

The present invention provides high wall plug efficiency light emitting devices by improving both the light extraction efficiency as well as the injection efficiency. The invention can be incorporated in a light emitting device of any semiconductor material system such as, but not restricted to, InGaN, InGaP, InGaAs, InP, or ZnO. A GaN based LED having an epitaxial layer formed on a sapphire substrate is used as an example in the present invention.

GaN light emitting devices comprise a p-n junction heterostructure of refractive index about 2.45. When the light emitting device is forward biased, spontaneously-emitted photons are generated. If the wavevector of the photon resides below the light line (in a frequency-wavevector diagram) of the material, the photon is totally internally reflected and trapped in the high refractive index of the epi-material.

Table 1 below lists the approximate extraction enhancement achieved using the different techniques commonly employed to extract light from the top surface of an unpackaged vertical LED. The enhancement factor given represents the multiplicative improvement over the performance of a reference, bare, unroughened light emitting device. The numbers are based on an example structure whereby the mirror is assumed to be 100% reflective and the location of the multiple quantum well (MQW) is optimised to direct most of the light within the light line of the structure and to achieve a cavity type effect. Only about 4.35% of the light is extracted out of the top surface of a bare unroughened LED.

TABLE 1

| Extraction technique | Extraction enhancement |
| --- | --- |
| Mirror | 2.0 |
| Microcavity | 1.75 |
| Roughening techniques | 2.5 |

The present invention provides an electrically-efficient, vertical flip-chip, thin-film light emitting device with a conducting substrate or carrier incorporating a low optical loss bottom reflector and low optical loss top contact. The incorporation of low loss conductive reflectors on the bottom and top contacts allows trapped modes to propagate in the high index light emitting device until they are efficiently extracted by the top surface texturing or by the edge facets. The reflectors comprise a conductive multilayer stack that is designed to efficiently reflect incident light while still maintaining high current injection efficiency.

Figure 1:
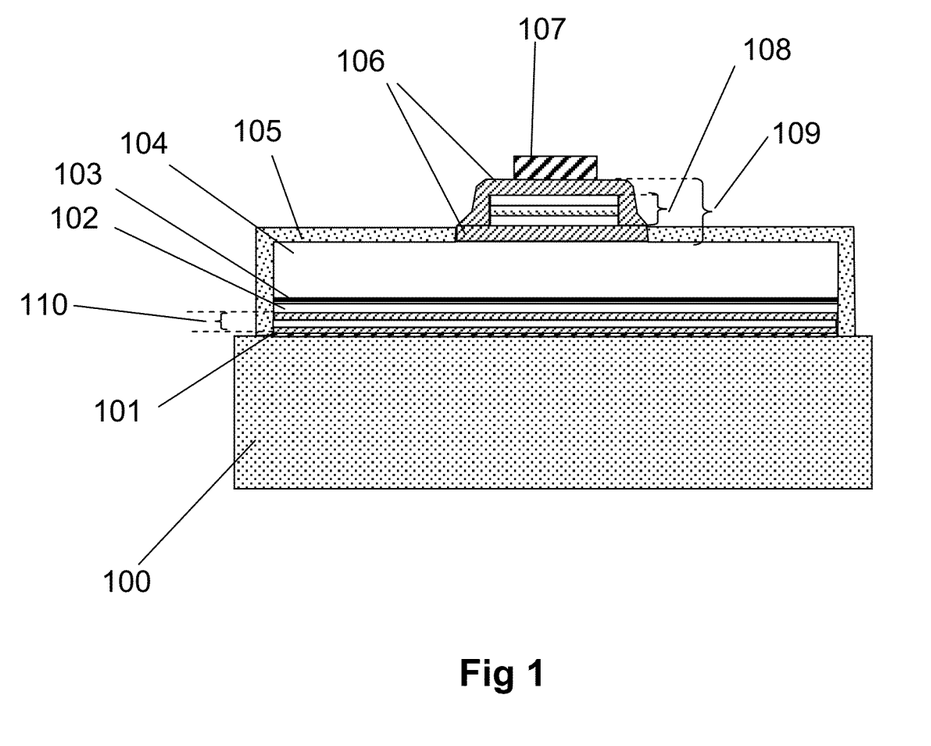
FIG. 1 shows a cross section of a first example of the light emitting device of the present invention.

In a first embodiment of the present invention, shown in FIG. 1, a novel low loss bottom conductive multilayer reflector (CMR) stack, 110, is employed between the metal bottom contact, 101, and the p-GaN flip chip layer, 102. The layer 101 may also comprise a multilayer of electrical and thermal conducting metals optimised for maximal adhesion and highest optical reflectivity. The layer 101 resides on top of a conductive substrate 100, which also acts as the bottom p-contact. The CMR comprises at least 3 material layers, but may comprise 4 layers, 5 layers or more. The bottom CMR stack comprises transparent conductive materials. The materials of the layers in the CMR stack are selected and stacked to maximise the dielectric contrast between neighbouring layers. Hence, materials with alternating low and high refractive indexes are employed in the same stack.

The reflectivity characteristics of the stack can be analysed by using the transfer matrix method (TMM) or other similar modelling technique. The CMR can comprise of any combination of multilayer stack design. It is an object of the invention to implement a high reflectivity multilayer stack that can reflect the largest percentage of trapped modes without introducing optical loss. Some examples of possible multilayer stack configurations are Omni-directional reflectors (ODR), periodic, aperiodic, binary, or quasiperiodic.

Determining the power reflectivity of the CMR stack The transfer matrix method for calculating the reflectivity of a CMR stack is described as follows. Firstly, the transmission and reflection of a single layer in the stack is determined as follows:

$$\begin{pmatrix} E_{i-1} \\ H_{i-1} \end{pmatrix} = M_i \begin{pmatrix} E_i \\ H_i \end{pmatrix} \quad (1)$$

where E and H, respectively, represent the Electric and the Magnetic field residing in the stack, and $M_i$ represents the transformation matrix for the i-th layer in the stack. The transformation matrix is given by $$M_i = \begin{pmatrix} \cos(k_i d_i) & -jZ_i \sin(k_i d_i) \\ \dfrac{-j\sin(k_i d_i)}{Z_i} & \cos(k_i d_i) \end{pmatrix} \quad (2)$$

where the wave-vector is defined as $k_i = 2\pi n_i/\lambda$ for refractive index $n_i$, and the electromagnetic impedance $Z_i$ is defined as $Z_i = Z_o/n_i$, with reference to the impedance of free space $Z_o$. The angle $\theta_i$ defines the propagation angle of the wavevector in the i-th layer. To determine the reflection and transmission coefficients of the complete CMR stack with N layers, the product of the transformation matrix of all the layers is calculated, as follows:

$$M = \prod_{n=1}^{N} M_n = M_1 \times \ldots \times M_N = \begin{pmatrix} m_{11} & m_{12} \\ m_{21} & m_{22} \end{pmatrix} \quad (3)$$

Equations (1) and (3) are then combined to relate the fields at the first and Nth layers, as follows:

$$\begin{pmatrix} E_1 \\ H_1 \end{pmatrix} = M \begin{pmatrix} E_N \\ H_N \end{pmatrix} = \begin{pmatrix} m_{11} & m_{12} \\ m_{21} & m_{22} \end{pmatrix} \begin{pmatrix} E_N \\ H_N \end{pmatrix} \quad (4)$$

Finally, the transmission and reflection coefficients of the complete CMR stack may be calculated, whereby the power reflectivity of the CMR stack is given by:

$$R = \left| \frac{Z_{N+1} m_{11} + m_{12} - Z_1 Z_{N+1} m_{21} - Z_1 m_{22}}{Z_{N+1} m_{11} + m_{12} + Z_1 Z_{N+1} m_{21} - Z_1 m_{22}} \right|^2 \quad (5)$$

The transparent conductive materials in the bottom CMR stack can comprise multilayers of optically transparent metal oxides or nitrides such as, but not limited to, ZnO, Indium Tin Oxide (ITO), Titanium oxide, GaN or Carbon Nanotubes (CNT) or transparent conductive metal oxides with a spinel crystal structure. Such materials typically possess high refractive indexes of approximately between 1.8 and 2.45. These materials provide suitable candidates for the high refractive index layers in the CMR stack. The index value of the high refractive index material can also exceed that of the light emitting region, for example up to 2.6, or up to 2.8. For the low refractive index layers, metal oxides or nitrides or oxyntrides with higher porosity, such as ITO nanorods, GaN nanocolumns, AlN nanocolumns, ZnO doped with Silicon or MgF can be deposited, providing a low refractive index of around 1.3. Transparent conductive polymer materials can also be used. Examples of these include poly(ethylenedioxythiophene):poly(styrenesulfonate) (PEDOT:PSS) or polyaniline:poly(styrenesulfonate) (PANI:PSS), having refractive indexes of about 1.5. The refractive index of the low refractive index material can reside between 1.0 and that of the index of the light emitting material, which in the case of GaN is 2.45.

As shown in FIG. 1, the vertical type light emitting device structure of the present invention further comprises an n-type GaN layer, 104, as well as the light emitting Multiple Quantum Well region, 103, sandwiched between layer 102 and 104.

In a preferred embodiment of the invention, the top multilayer metal n-contact region, 107, is deposited on top of another CMR stack region, 109. The multilayer of metal can comprise a thin adhesion layer to reduce contact resistance followed by a reflective metallic layer followed by a metallic electrode.

The top CMR stack is incorporated to reduce the photon absorption and total light output attenuation from the light emitted under the top contact region. The top electrode layer extends across a proportion of the area of the light extracting surface of the second semiconductor layer that is more than 1%, preferably more than 3%, more preferably more than 5%, even more preferably more than 10%, still more preferably more than 25%, and most preferably more than 50%. Hence, if the light emerging from under these regions can be allowed to escape with minimum loss, then an increase in the total luminous output of the LED can be achieved.

The top CMR stack, 109, can comprise of similar transparent conductive materials used in the bottom CMR stack 110. However, another object of the present invention is to provide a CMR stack of mainly dielectric materials, 108, surrounded by a transparent conductive material, 106. The layer 108 comprises of at least 3 material layers, but may comprise of 4 layers, 5 layers or more. The multilayer 108 is optimised for maximum omnidirectional reflectivity, while the layer 106 is selected for optical transparency and maximal electrical conductivity. Layer 106 can comprise of similar materials selected for use in CMR 110, while for layer 108 a much wider selection of optically transparent dielectrics commonly employed for optical coatings can be selected. These can include, but is not limited to, Silicon Nitride or Silicon Dioxide, metal oxides, nitrides or oxynitrides, such as derived from the following metals: Al, Hf, Ta, Ti, Cr, Zr. The conductive layer 106 resides on top of the n-GaN surface to provide a good electrical contact, as well as overcoating the multilayer 106 to provide a path for electrical current to propagate from contact 107 to the n-GaN material 104.

The final light emitting device is surrounded by a passivation layer, 105, to protect the GaN material from the environment and from oxidation. The passivation material may comprise Silicon Dioxide, Silicon Nitride or a polymer layer, although other materials are possible.

Figure 2:
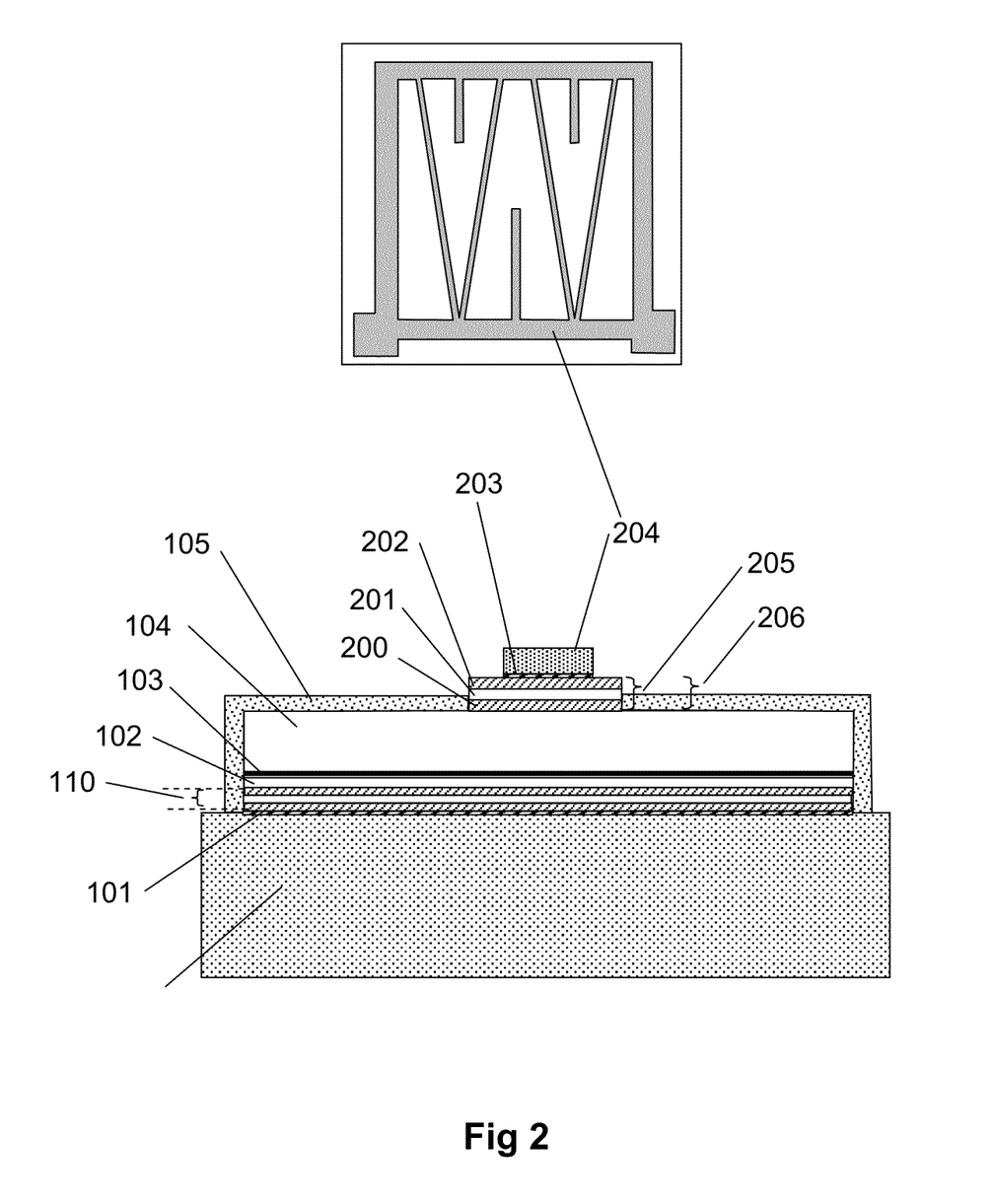
FIG. 2 shows a cross section of a second example of the light emitting device of the present invention.

As shown in FIG. 2, in one embodiment the top CMR stack, 206, can comprise of transparent conductive materials similar to those in bottom stack 110. The CMR stack 206 is designed, and constituent materials are selected in a similar way, to the bottom CMR stack 110. In the example described in FIG. 2, a 3-layer multilayer stack is implemented. The first layer 200 can comprise, for example, of a low refractive index material such as doped ZnO, followed by a layer 201 of higher refractive index ITO, followed by a layer 202 of a lower refractive index material, e.g. doped ZnO. The thickness of each layer is optimised to provide maximal reflection of incident photons back into the GaN material. In this case the transparent conductive surrounding overcoat is not required, since in this example the top n-type contact 204 may be deposited on top of a thin metal layer 203, which will perform similar functions to layer 101 in terms of improved adhesion and electrical conductivity.

As an outcome of the low loss reflective top electrodes, it is an object of the present invention to increase the percentage coverage of the top electrodes to allow for improved current injection when high current density LED operation is required. The top electrode density is increased to 5%, preferably 10%, more preferably 15%, and even more preferably 20% of the total top active surface of the LED device. The increased density allows improved current spreading along the n-GaN layer maintaining high injection efficiency even at high drive current of, for example, 1 A, 1.5 A, 2 A, 2.5 A, or 3 A. Due to the novel low loss top electrodes the increased coverage will not to detrimental to the light extraction efficiency of the LED. An example plan view of the top electrode is sketched in the insert in FIG. 2. Two square pads at the bottom edge of the LED device exist for wire bonding. Cross connected electrodes across the top surface allows for improved even current spreading across the surface of the n-doped material 104. The spacing as well as width of electrodes directly relates to the efficiency of injecting the carriers at high current into the LED device.

Figure 3A:
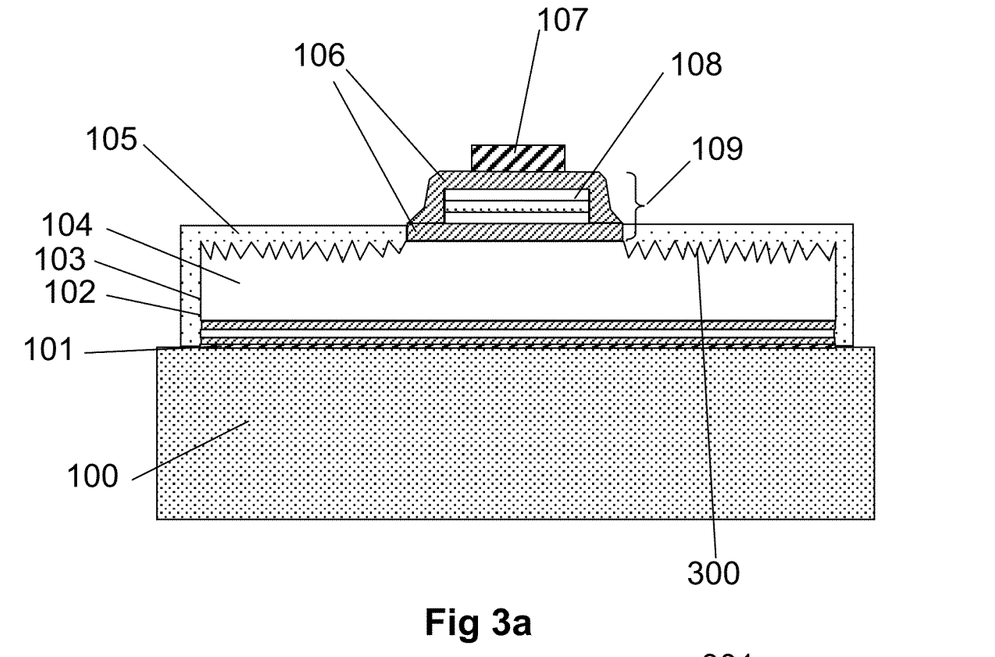
FIGS. 3a and 3b show a cross section of two embodiments of a first type of light emitting diode of the present invention with top surface roughening.

In a preferred embodiment of the invention the top n-doped GaN material 104 is roughened to allow for increased probability of light escaping out of the top surface of the LED. FIG. 3a shows an example of such roughening, using the device shown in FIG. 1, whereby the upper surface 300 of layer 104 is roughened. The roughening process introduces many scattering centres at the surface of the LED to allow light an increased chance of escape out of the top surface. The scattering centres increase the probability of photons incident on the roughened surface 300 lying inside the GaN-air escape cone angle.

The roughening can take many different forms, including wet-etched pyramidal or inverted pyramidal structures on the surface of the GaN material, as-deposited clusters of high refractive index optically transparent dielectrics, or additionally as perturbed re-growth of a high refractive index materials. If small scale roughness, of the order of the emitted wavelength ($\sim\lambda/n_{GaN}$) is introduced, trapped modes incident on the surface experience diffuse reflectivity as opposed to specular reflectivity, thereby increasing their chance of residing within the escape cone at the next multiple internal reflection. In a preferred embodiment of the present invention, the top emission surface is randomly arranged with protruding pyramids ranging in size between approximately 0.5 μm and 2.5 μm, thereby providing high extraction efficiency for trapped waveguide modes. Top surface extraction enhancement factors of up to 2.5, 3.0, 3.5, 4.0, 5.0, or 6.0 may be realised, as compared to a bare, unroughened, unencapsulated LED with approximately 4.35% of the light emitted from the top surface.

Figure 3B:
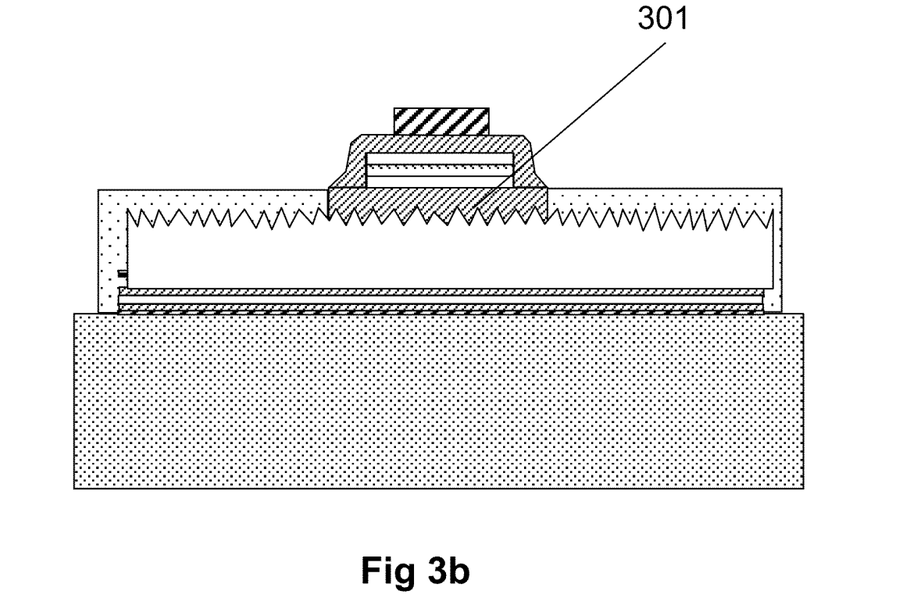

In FIG. 3b, another embodiment of a roughened top n-doped GaN surface is demonstrated. In this case, the n-GaN top surface region 301 under the top CMR contact, is also roughened. This allows light that was specularly reflected by the top contact region to diffusely reflect back down, thereby increasing the probability of the light residing in the escape cone at the next incidence on the top roughened surface.

Figure 4A:
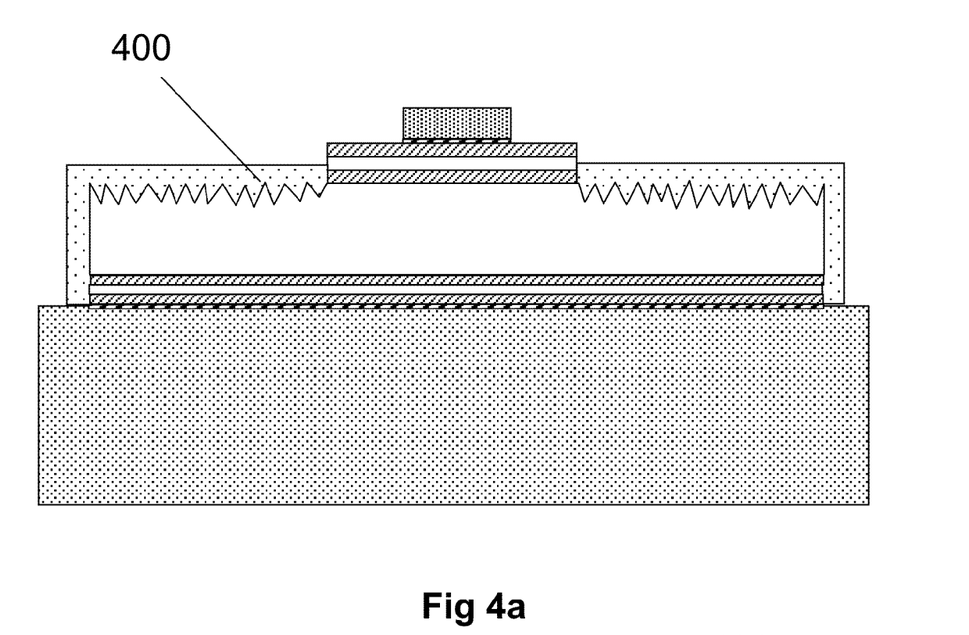
FIGS. 4a and 4b show a cross section of two embodiments of a second type of light emitting diode of the present invention with top surface roughening.
Figure 4B:
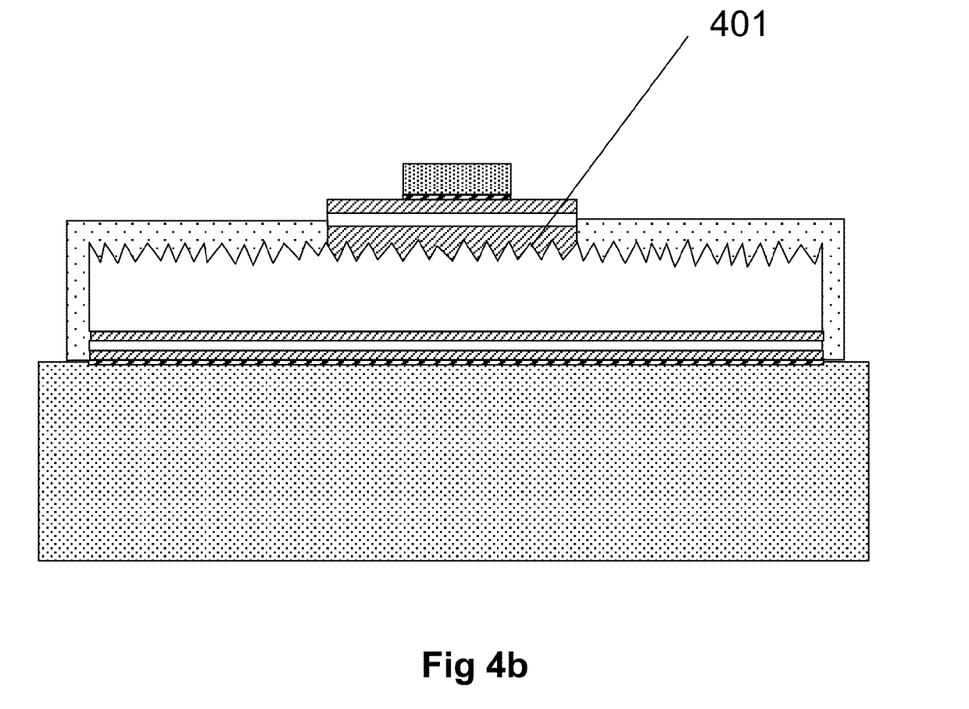

FIGS. 4a and 4b show other exemplary illustrations of surface roughening employed in the embodiment of the present invention shown in FIG. 1. In the example shown in FIG. 4a, surface roughness 400 is applied to a LED with a top and bottom transparent CMR stack. In another example, shown in FIG. 4b, the surface roughness is also applied to the top surface of the n-GaN region under the top CMR stack, as indicated by 401.

Figure 5A:
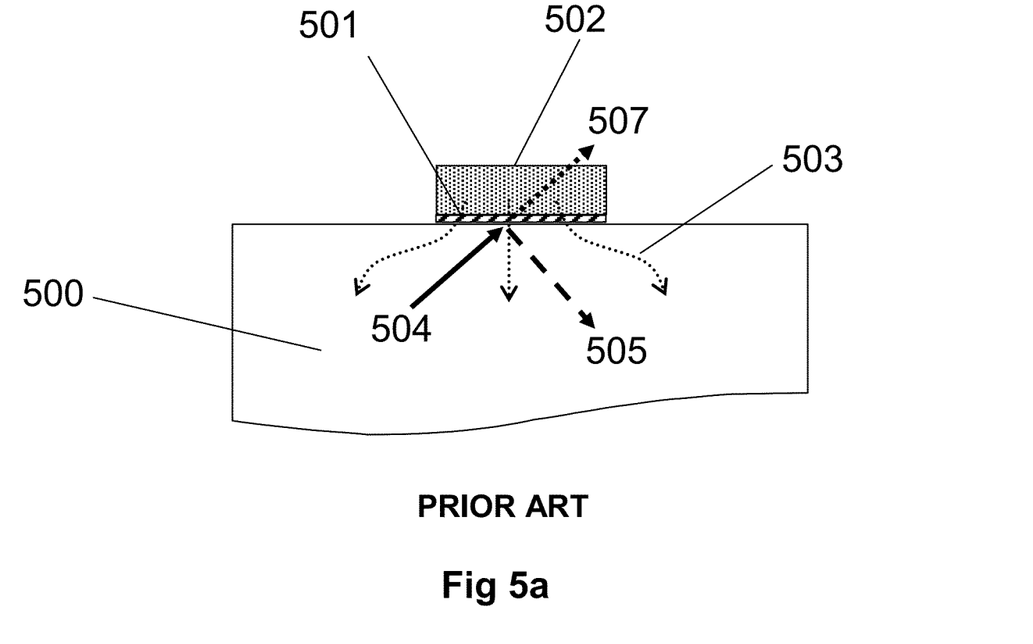
FIG. 5a illustrates the loss experienced by trapped photons incident on a top surface metal contact in a known device.
Figure 5B:
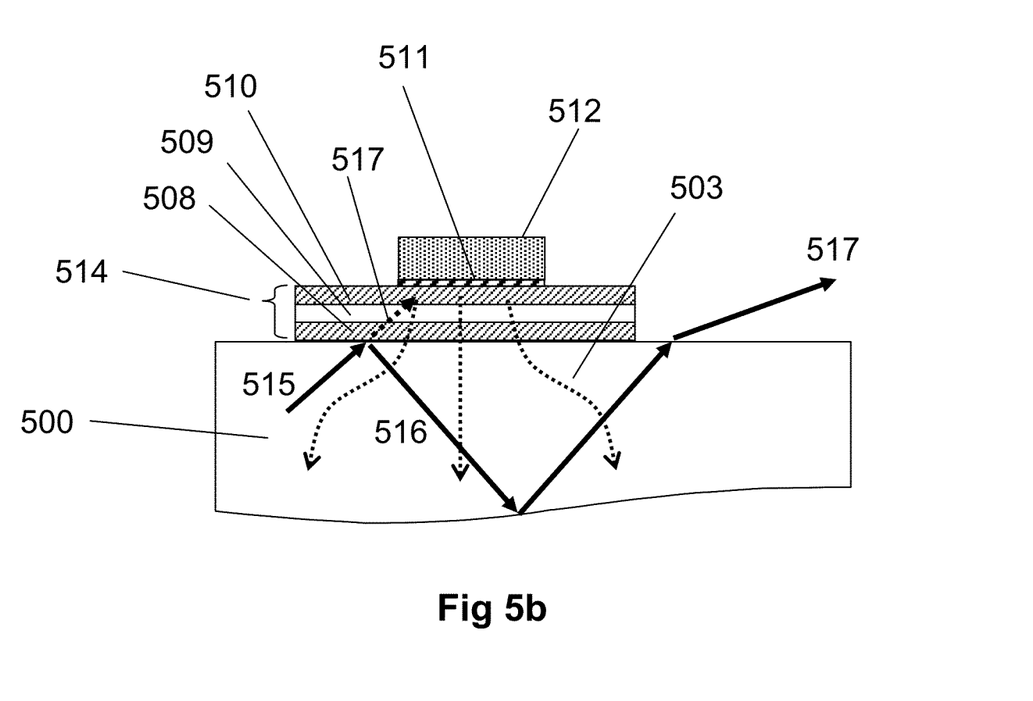
FIG. 5b illustrates the minimal loss experienced by trapped photons incident on a metal contact in a device of the present invention.

In FIGS. 5a and 5b, the benefits of the present invention are compared with prior art designs for top metal contacts. In FIG. 5a, a prior art device with a top metal contact is illustrated. The metal contact, 502, adheres to the top of the n-GaN material of the LED structure, 500, by use of an adhesion layer 501. Electrical injection, 503, and carrier diffusion into the n-type material is achieved by the direct metal contact. However, trapped photons 504 incident on the metal contact 502 experience a large amount of optical loss, 507, and specular reflection 505 is greatly attenuated. By contrast, in FIG. 5b, an example of the operation of the present invention is demonstrated. The top transparent CMR stack 514 resides between the metal contact 512 and the LED n-type GaN material 500. A metal adhesion layer 511 between the 514 and 512 allows for improved adhesion between the metal contact and the 514 CMR stack. In this case trapped photons 515 incident on the transparent CMR stack reside in the electromagnetic bandgap of the reflector and are forbidden to propagate through the stack 517 and onto the metal contact 512. The evanescent field set up inside the CMR stack, 514, due to the optically transparent reflector, allows a very low loss optical reflection 516 back into the GaN material.

For the examples described herein, the transfer matrix method is used to determine the normal incidence reflectance of photons in the blue wavelength range. The typical examples illustrated in FIG. 5a and FIG. 5b, are considered in particular. For the prior art approach shown in FIG. 5a, the reflectivity of different metal electrodes is compared in Table 2 in terms of the power reflectance in the blue wavelength range. From the selection of metals shown, the highest reflecting metals are Ag and Al, whereby approximately 11.3% and 16.7% respectively of loss is introduced at every reflectance, as indicated by 505 in FIG. 5a. It is typical for light to undergo several reflections in the LED device prior to extraction and hence the overall loss experienced by the photons is typically many orders larger than the base figure quoted.

TABLE 2

| Metal | Reflectance (%) |
|---|---|
| Au | 18.7 |
| Ag | 88.7 |
| Ni | 16.7 |
| Cr | 30.6 |
| Al | 83.3 |

For comparison with the present invention, a conductive CMR stack, as shown in FIG. 5b, will be demonstrated utilising doped ZnO of refractive index n=1.3 and ITO of refractive index n=2.1. The composition of the multilayer stack is highlighted in Table 3, including material, refractive index and thickness. The layers are listed in order of proximity to the underlying semiconductor layer 500. Layer numbers 1 to 4 listed in Table 3 lie in the CMR stack 514, while layer number 5 is the metal electrode layer 512 shown in FIG. 5b. The total CMR thickness amounts to approximately 270 nm with a reflectance of 98.5%.

TABLE 3

| Layer number | Material | Refractive index | Thickness (nm) |
|---|---|---|---|
| 1 | Doped ZnO | 1.3 | 85 |
| 2 | ITO | 2.1 | 55 |
| 3 | Doped ZnO | 1.3 | 85 |
| 4 | ITO | 2.1 | 85 |
| 5 | electrode - Ag | 0.15 + j2.5 | >50 nm |

The improvement in the efficiency of the alternative electrode designs of the present invention over those of the prior art becomes apparent when light trapped in the LED device experiences multiple passes in the vicinity of the electrodes. The resultant effect is illustrated in Table 4, which shows a comparison of the relative power remaining in a photon after experiencing multiple reflections in an LED of the present invention and an LED of the prior art, respectively. The percentage improvement in an LED of the present invention over the prior art device is indicated in the final column.

TABLE 4

| Number of reflections | Power remaining in LED of present invention | Power remaining in prior art LED (Ag metal) | Improvement |
|---|---|---|---|
| 1 | 0.985 | 0.887 | 11.0% |
| 2 | 0.970 | 0.787 | 23.3% |
| 4 | 0.941 | 0.619 | 52.0% |

Additionally, as illustrated in FIG. 5a and FIG. 5b, in both cases the finite size of the contact inhibits light emitted under the contact from escaping. However, as illustrated in FIG. 5b, in the present invention this trapped light is not attenuated by the contact, but is allowed to escape after subsequent multiple total internal reflections, eventually escaping out of the LED surface as indicated by 517. This allows for an increase in the total luminous output of the LED.

Figure 6:
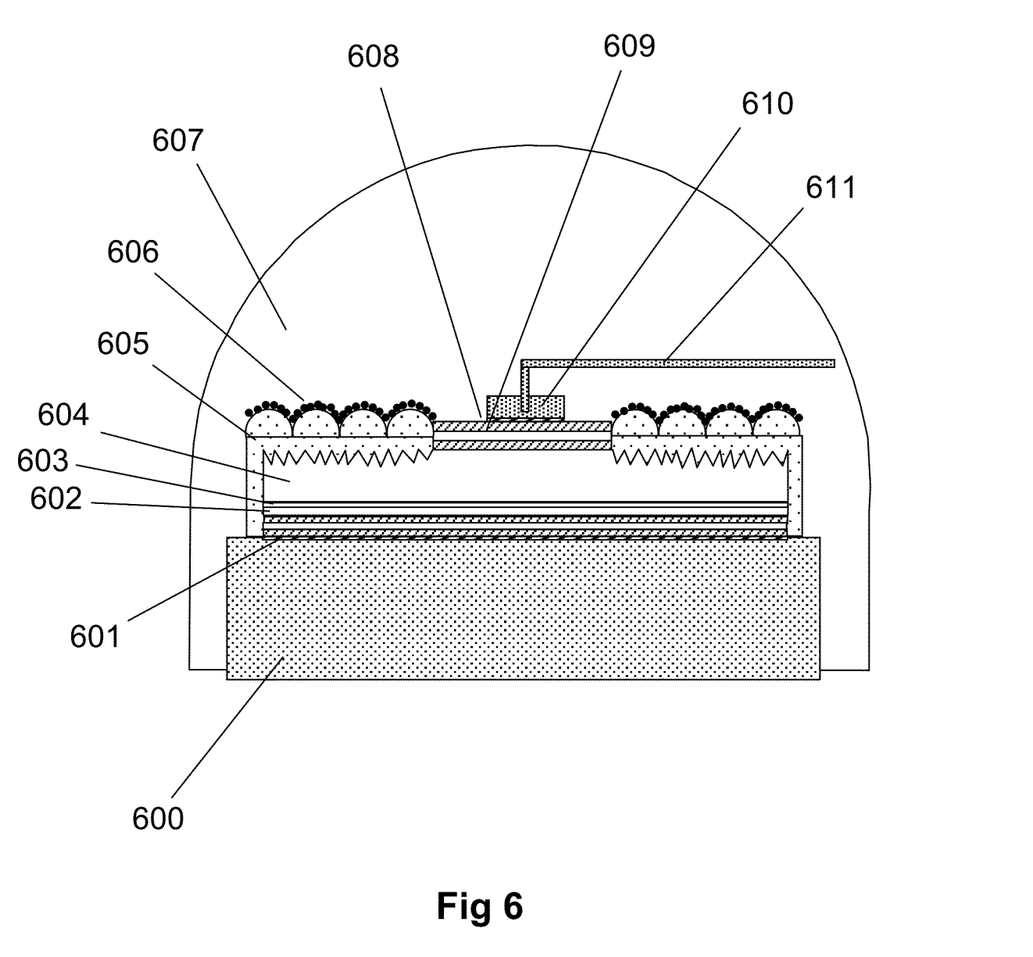
FIG. 6 shows a cross-section of a light emitting module of the present invention for use in solid state lighting applications.

In a second aspect of the present invention, as shown in FIG. 6, a light emitting module is formed by embedding a phosphor, 606, in an encapsulating material residing on top of a light emitting device of the present invention. The encapsulation comprises two layers of optically-transparent and environmentally-resistant material. The first encapsulation material, 605, that is disposed proximal to the light emitting device, is formed of a high refractive index material. The material is preferably textured or shaped to extract the maximum number of photons, but need not be. The encapsulant 605 can comprise a silicone material having a refractive index of approximately 2.1, 2.0, 1.8, or 1.6, but may have other refractive index or comprise other material. A high refractive index encapsulant allows a larger amount of light to escape from the roughened surface of the LED due to the larger escape cone angle. Texturing of the encapsulant can also be used to alter the far-field radiation profile of the LED. This may be in the form of a Fresnel lens or microlens texturing.

The phosphor is subsequently disposed on the high refractive index encapsulant 605, while another encapsulation material 607, distal to the light emitting device, is disposed on the top of the phosphor. The phosphor 606 is located proximal, but not in contact with, the top n-GaN 604 LED material to avoid thermal heating of the phosphor and improve its lifetime. The phosphors may comprise of, but are not limited to, YAG:Ce, phosphors based on II-VI materials such as selenides, tellurides and sulphides and ZnS and InP, and also Europium doped Silicate phosphors, and Cerium and Terbium doped oxides and nitrides. In these examples, the combined emission from the phosphor and the LED are designed to emit the desired colour.

The distal encapsulant 607 can also be shaped to provide the desired far field emission from the light emitting module. The shaping can vary from horizontally flat to hemispherical, for Lambertian emission, to parabolic for directional emission, and to other more complex shapes for many different desired far-field emission profiles. The encapsulant 607 also acts as a passivation layer to protect and seal the LED from environmental factors. Additionally, the encapsulant 605 and

607 may comprise the same material. Another passivation layer may also reside between the first encapsulation layer 605 and the LED device, as described in the method of manufacture below. The encapsulants can comprise, but are not limited to, silicone gels and resins and elastomers, ABS resins, epoxy, acrylates, spin on glass, PMMA, and thermoplastics and thermosetting resins.

An adhesion layer and reflector layer, 606, such as Ni/Au, or Ag is deposited on top of layer 609. A metal contact, 610, is placed subsequently on layer 608. This acts as an electrode to spread current across the surface on the LED, as well as a region with an adhesion surface for wire bonding. Electrical contact is made by wire 611 contacting the top electrode, while the circuit is closed by making another contact with the conductive carrier 600.

The light emitting module may be used for applications where white illumination is required, such as in solid state lighting. Other uses include architectural, medical or signage applications.

In a preferred embodiment of the present invention, the bottom and top CMR stack layers allows the light emitting device to be thinned down to a total thickness of less than 5 µm, preferably less than 3.5 µm, more preferably less than 3.0 µm, still more preferably less than 2.5 µm, even more preferably less than 2.0 µm, and most preferably less than 1.0 µm. This allows the LED to achieve high extraction efficiency while still maintaining high current injection. For example, if the LED structure of FIG. 1 is revisited, layers 104, 103 and 102 of the LED waveguide structure are reduced in thickness, thereby allowing fewer confined modes to reside in the waveguide and hence more efficient light extraction. Typically, a 3 micron structure will possess approximately 44 trapped modes while a thinner 1 micron LED structure can sustain approximately 15 trapped modes. Fewer modes allow surface extraction techniques such as roughening to perturb a large percentage of the trapped mode residing in the waveguide and hence will enable efficient coupling of the trapped mode into leaky modes and subsequent extraction over a short propagation distance.

One drawback of reducing the thickness of the LED device is the reduction in the ability for the n-doped material 104, such as n-GaN, to spread carriers horizontally, which ultimately causes current crowding in the layer 104 and thus affects the injection efficiency of the LED. It is an object of the present invention that, by using the low loss conductive CMR stacks, an increased percentage coverage of the top electrodes is introduced to minimise current crowding and allow improved current injection and high drive current in thin LED devices. Top electrodes can be introduced at intervals of a minimum of 100 µm, 80 µm, 60 µm, 40 µm, or 20 µm.

Method of Manufacture

In the final aspect of the present invention a method of manufacture of a vertical LED structure with a metallic substrate and reduced loss metal contact regions is proposed. The metal substrate provides both good thermal and electrical conduction during LED operation. Other benefits of vertical LED structures arise from the existence of one top metal contact rather than two, which effectively increases the active top emission area. The large area bottom metal contact also improves the electro-static discharge capabilities of the device. An example of the complete process is shown in FIGS. 7a to 7g.

Figure 7A:
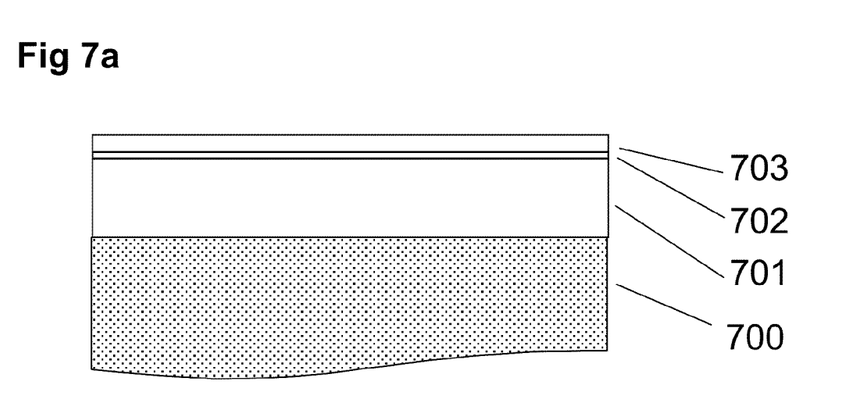

FIG. 7a shows an example of a GaN based LED epitaxially grown on a suitable growth wafer 700. The growth wafer can comprise, but is not limited to, Sapphire, Silicon Carbide, free-standing GaN or any other lattice matched material. The growth wafer can also comprise Si, as this is particularly beneficial when moving to larger six inch (152.4 mm) wafer diameters.

The LED device comprises at least n-type semiconductor layer 701, followed by an active light emitting region 702, subsequently followed by a top p-doped semiconductor material 703. The active region 702 can comprise a single quantum well (QW) region or multiple quantum wells (MQW). These layers are grown by conventional semiconductor growth techniques, such as metal organic vapour phase epitaxy (MOCVD), molecular beam epitaxy (MBE), or alternatively atomic layer deposition (ALD).

In the case of an n-GaN layer 701, the layer can have a thickness of about 0.5 µm, about 1.5 µm, about 2.0 µm, about 2.5 µm, about 3 µm or about 4 µm. The MQW region 702 may comprise InGaN/GaN or AlGaN/GaN multilayer stacks. When these layers are forward biased they can emit light in the wavelength range between 240 nm and 680 nm. In the case of the p-doped GaN layer, the thickness can vary between 5 nm and 400 nm, for example about 50 nm, about 100 nm, about 150 nm, or about 180 nm. It is important to note that the structure will be inverted and hence the current top surface will reside at the bottom of the device once the processing steps are complete.

Figure 7B:
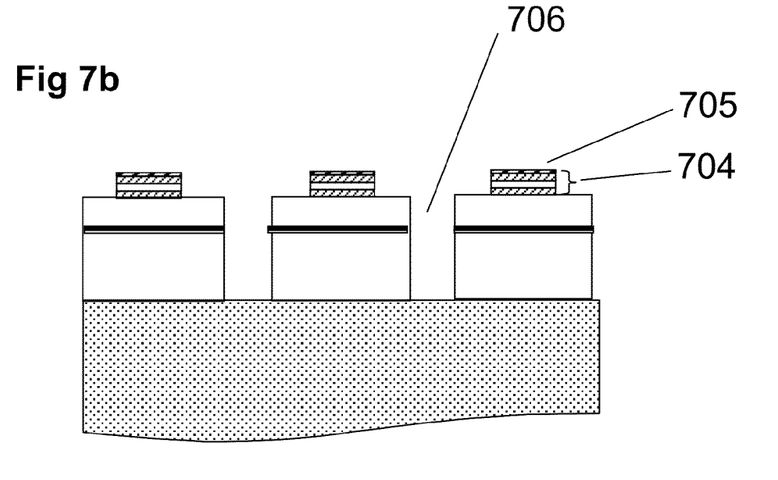

As shown in FIG. 7b, the bottom transparent CMR stack is then deposited. This can be carried out by any conventional deposition technique such as, but not limited to, any chemical vapour deposition technique (CVD), including low-pressure chemical vapour deposition (LPCVD), plasma-enhanced chemical vapour deposition (PECVD), atomic layer deposition (ALD), or other techniques such as sputtering or evaporation. A first metallic low resistivity contact layer 705 is subsequently deposited on the structure. This layer also acts as a good adhesion layer between the metal permanent substrate and the underlying p-doped GaN or semiconductor region. This contact region preferably comprises one or more of Ni/Au, Ti/Au, Cr/Au, Au, Pd, Pt, Ru, Ni, Cr, ZnO, CNT, Ag, ITO, Al, and W, although other suitable materials may be used. As a result of the present invention, a larger selection of conductive adhesion metal layers can be employed, since the reflector 704 resides between layer 705 and the p-GaN region 703 and therefore optically lossy metallic layers can also be utilised.

The bottom contact region is defined lithographically and transferred into the transparent CMR stack and the metal layer as shown by 704 and 705 in FIG. 7b. The bottom contact region pattern may be etched by any etching technique suitable for materials residing in the transparent CMR stack and the metal 705, including wet etching or plasma etching, reactive ion etching (RIE) and inductively coupled plasma (ICP).

Following the definition of the bottom CMR stack, the LED die regions are defined lithographically and etched to form trenches, 706, isolating the individual LED die, as shown in FIG. 7b. The formation of the individual LED die prior to flip chip and growth wafer removal allows improved stress relief.

Figure 7C:
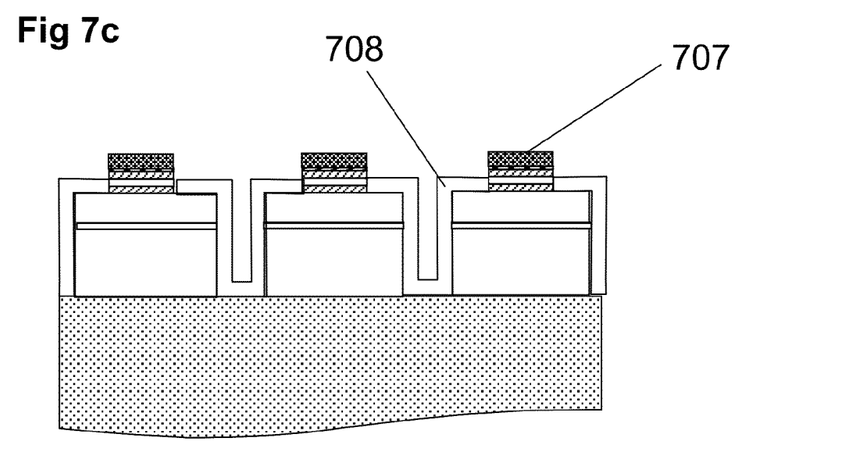

As shown in FIG. 7c, a passivation layer 708 is then allowed to fill and overcoat the trenches 706. The passivation layer can comprise, but is not limited to, $SiO_2$, $Si_3N_4$, polymer or spin-on-glass. Subsequently, a metal seed layer 707 is grown on top of the adhesion layer 705. The passivation layer acts to protect the GaN from environmental factors, as well as avoid the conductive seed layer shorting the LED structure. Layer 707 provides the seeding for any subsequent chemical plating process. This layer can comprise metals such as Cr, Cu, Pt, Au, Ag, Ti, Ni, and Pd.

Figure 7D:
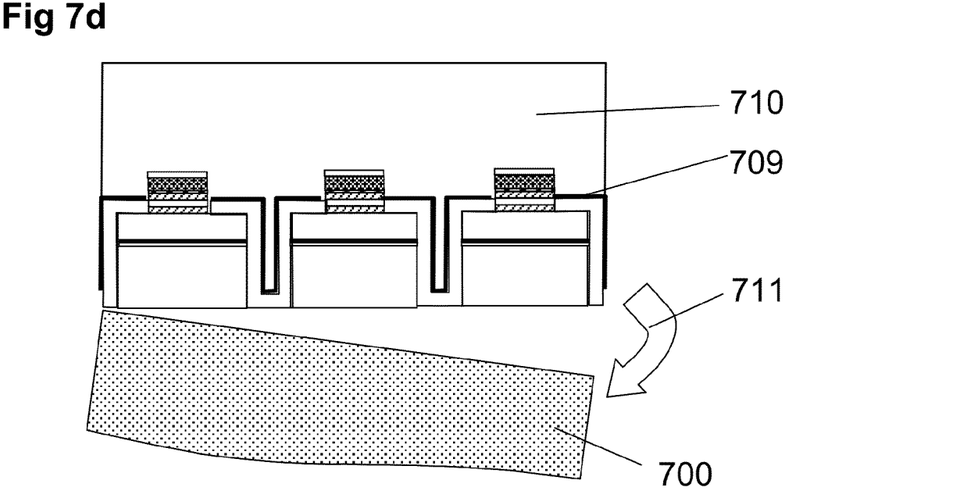

As shown in FIG. 7d, an additional metal adhesion layer 709 may optionally be deposited on the top surface of the passivation layer 708. The material can be selected from the same metals as for layer 705. Following the optional layer 709, the carrier metal substrate layer 710 is overgrown. This layer may comprise, but is not limited to, one of or a mixture of Au, Cu, Ni, Cr, Pt, Pd, In, and Al. The metal is grown by evaporation, sputtering, electroplating or electro-less plating. A thick layer of metal is formed with a thickness of approximately 20 μm, approximately 50 μm, approximately 100 μm, or approximately 150 μm. This thick layer 710 provides a rigid support to hold the underlying LED die during removal of the growth substrate 700. The removal process can be achieved by a selective etching process, a lift-off process such as laser lift-off, or a polishing method. A combination of such devices can also be implemented.

Figure 7E:
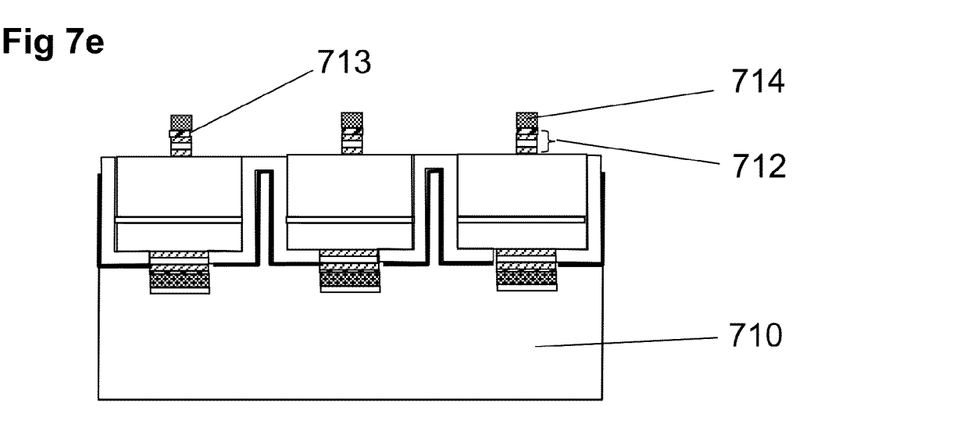
Figure 7F:
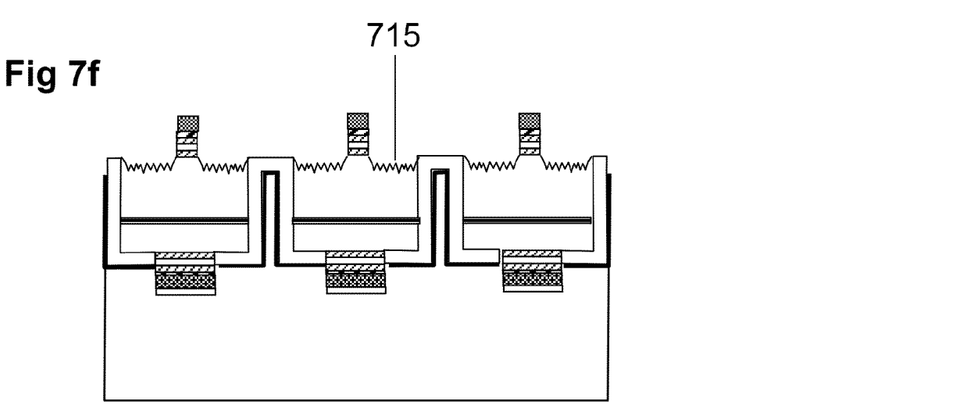

Following removal of the growth substrate 700, the LED dies are flipped, as shown in FIG. 7e. The new permanent carrier is now the thick metal layer 710 and the n-doped GaN or semiconductor material is the top exposed surface. The top conductive CMR stack is then deposited. The different layers in the multilayer stack are successively deposited using processes similar to those utilised for the bottom transparent CMR reflector. Subsequently, an adhesion layer is also deposited to assist with the bonding of the final top metal contact. An additional lithography and etch step is required at this stage to define the shape of the top transparent CMT stack. This will comprise similar processing steps to those used for CMR stack 704.

If, during the deposition of the transparent CMR reflector, one or more dielectric materials are introduced, then an overcoating, conductive, optically-transparent layer is deposited to allow electrical conduction between the top metal contact 714 and the N-doped GaN layer 701, as shown in FIG. 1. The selection criteria for suitable materials and deposition techniques for the overcoating layer are identical to those of the top and bottom CMR layers. Following deposition, another lithography mask pattern transfer and an etch step is included to redefine the location of the overcoated top contact region and to remove any conductive layer that extends further than one of 1 μm, 2 μm, 3 μm, 5 μm, or 10 μm around the perimeter of the transparent CMR reflector 712.

Finally, as shown in FIG. 7e, an n-type metal electrode contact pad 714 is patterned on top of the CMR stack 712 using a lift-off process. A lithography step and negative resist are employed to deposit the metal conformally on the top surface of the CMR stack. A wet or dry plasma etch are used to transfer the pattern into the resist.

In order to improve capability of the LED device to extract light from the top surface, the n-GaN material is roughened. This can be accomplished by many techniques, such as wet anisotropic etching or photo-assisted wet etching. In this case pyramids, inverted pyramids or whisker type roughness following the crystal plane of the GaN are formed by use of suitable chemicals, such as KOH. During wet etching, the concentration, temperature, UV irradiation and biasing of the samples can all be controlled to assist in roughening the surface. The pyramid diameter is preferably between 0.5 μm and 2.5 μm.

Alternatively, high refractive index (preferably larger than n=2.0) optically transparent clusters of size approximately 0.5 μm, 1.0 μm, 1.5 μm, and 2.0 μm can also be utilised instead of the wet etching process. Nanoclusters of materials such as $Si_3N_4$ or GaN crystals can be deposited on the surface of the n-GaN to improve light extraction.

Figure 7G:
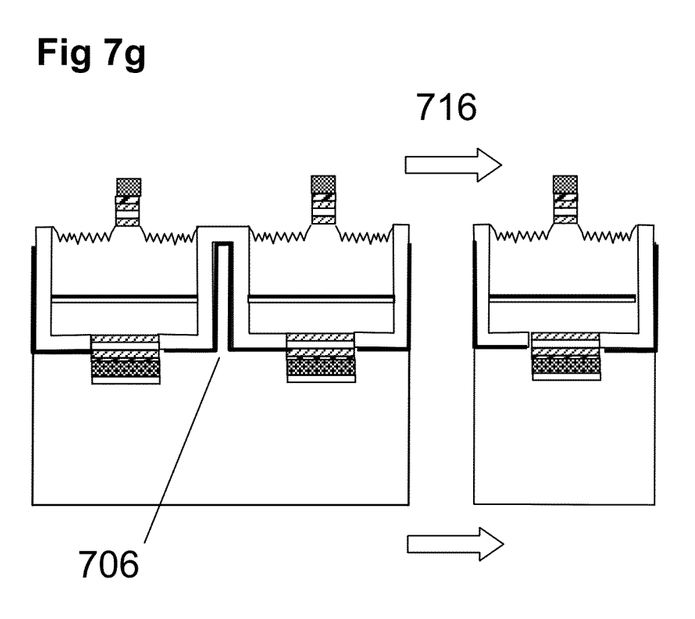

Finally, as shown in FIG. 7g, the individual LED die are separated along the trenches 706. The devices can subsequently be packaged with encapsulant and phosphors to produce complete solid state lighting modules, of the type shown in FIG. 6.

The invention claimed is:

1. A light emitting device comprising:
   a first semiconductor layer having doping of a first type;
   a second semiconductor layer having doping of a second type;
   a light emitting region interdisposed between the first and second semiconductor layers;
   a first electrode layer disposed proximal to the first semiconductor layer and distal to the second semiconductor layer;
   a second electrode layer disposed proximal to the second semiconductor layer and distal to the first semiconductor layer; and
   a first multilayer reflector stack interdisposed between the first electrode layer and the first semiconductor layer, the first multilayer reflector stack comprising at least a first layer disposed proximal the first electrode layer and a last layer disposed distal the first electrode layer,
   wherein:
   light generated in the light emitting region is extracted from the device through a surface of the second semiconductor layer;
   the first multilayer reflector stack extends at least partially across a surface of the first semiconductor layer;
   at least 60% of light incident on the first multilayer reflector stack that is generated in the light emitting region is reflected by the first multilayer reflector stack;
   at least the first and the last layer of the first multilayer reflector stack are electrically conducting and optically transparent; and
   the first multilayer reflector stack is configured for omnidirectional reflectivity.

2. A light emitting device according to claim 1, further comprising:
   a second multilayer reflector stack interdisposed between the second electrode layer and the second semiconductor layer, the second multilayer reflector stack comprising at least a first layer disposed distal the first electrode layer and a last layer disposed proximal the first electrode layer,
   wherein:
   the second multilayer reflector stack extends partially across the surface of the second semiconductor layer;
   at least 60% of the light incident on the second multilayer reflector stack that is generated in the light emitting region is reflected by the second stack; and,
   at least the first layer and the last layer of the second multilayer reflector stack are electrically conducting and optically transparent.

3. A light emitting device according to claim 1, wherein:
   the first multilayer reflector stack comprises at least 3 layers, preferably at least 4 layers, and most preferably at least 5 layers; and,
   the first multilayer reflector stack comprise at least two different optical refractive indices.

4. A light emitting device according to claim 1, wherein at least the first layer and the last layer of the first multilayer reflector stack are partially in direct physical contact in order to achieve electrical conduction between the first and last layer of the first multilayer reflector stack.

5. A light emitting device according to claim 1, wherein the second electrode layer extends across a proportion of the area of the light extracting surface of the second semiconductor layer that is more than 1%, preferably more than 3%, more preferably more than 5%, even more preferably more than 10%, still more preferably more than 25%, and most preferably more than 50%.

6. A light emitting device according to claim 1, wherein the first multilayer reflector stack comprises a dielectric material selected from a group which includes Magnesium Fluoride, Silicon Nitride, Silicon Dioxide, and metal oxides, nitrides and/or oxynitrides derived from a group of metals consisting of Aluminium, Hafnium, Tantalum, Titanium, Chromium, and Zirconium.

7. A light emitting device according to claim 1, wherein the electrically conducting and optically transparent layers in the first multilayer reflector stack comprise a material selected from the group consisting of ZnO, Indium Tin Oxide (ITO), GaN, Carbon NanoTubes (CNT), transparent conductive metal oxide, transparent conductive nitride, transparent conductive oxide with spinel crystal structure, ITO nanorods, GaN nanocoloumds, AlN nanocoloumns, ZnO doped with Silicon, transparent conductive polymer, poly(ethylenedioxythiophene) : poly(styrenesulfonate) (PEDOT:PSS), polyaniline : poly(styrenesulonate) (PANI:PSS).

8. A light emitting device according to claim 1, wherein the surface of the second semiconductor layer through which light is extracted is at least partially roughened to increase the light extraction.

9. A light emitting device according claim 1, wherein the total combined thickness of the first semiconductor layer, the second semiconductor layer and the light emitting region is less than 3.5 microns, preferably less than 3.0 microns, more preferably less than 2.5 microns, even more preferably less than 2.0 microns, and most preferably less than 1.5 microns.

10. A light emitting device according to claim 1, wherein exposed surfaces of the first semiconductor layer, the second semiconductor layer and the light emitting region are at least partially overcoated with a passivation layer to protect the light emitting device.

11. A light emitting module for solid state lighting applications comprising:
a light emitting device according to claim 1;
a first encapsulating material covering at least the light extracting surface of the second semiconductor layer;
a second encapsulating material overcoating at least the first encapsulating material; and,
a phosphor material interdisposed between the first and the second encapsulating materials.

12. A light emitting module according to claim 11, wherein at least a surface portion of the first encapsulating material distal the light extracting surface of the second semiconductor layer is textured for maximum light extraction.

13. A method of manufacturing the light emitting device of claim 1, the method comprising the steps of:
growing each of the second semiconductor material, the light emitting region, and the first semiconductor material on a growth substrate;
depositing the first multilayer reflector stack;
forming mesa isolation trenches in the light emitting device;
depositing a first electrode;
attaching a conductive sub-mount;
removing the growth substrate;
depositing a second electrode;
and
separating an isolated light emitting die.

14. A method of manufacturing the light emitting device of the light emitting module of claim 11, the method comprising the steps of:
growing each of the second semiconductor material, the light emitting region, and the first semiconductor material on a growth substrate;
depositing the first multilayer reflector stack;
forming mesa isolation trenches in the light emitting device;
depositing a first electrode;
attaching a conductive sub-mount;
removing the growth substrate;
depositing a second electrode;
separating an isolated light emitting die; and
packaging the isolated light emitting die with an encapsulation.

15. A method of manufacturing according to claim 13, further comprising the step of depositing a second multilayer reflector stack after removing the growth substrate.

16. A method of manufacturing according to claim 13, further comprising the step of roughening a top surface of the second semiconductor layer prior to separating the isolated die.

17. A method of manufacturing according to claim 13, further comprising the step of depositing a passivation layer.

* * * * *